United States Patent [19]

Damast et al.

[11] 3,934,526

[45] Jan. 27, 1976

[54] ULTRASONIC CUTTING APPARATUS

[75] Inventors: Martin A. Damast, Brightwaters; Vincent P. Abberton, Westbury; Kusler Celestin, New York, all of N.Y.

[73] Assignee: Cavitron Corporation, New York, N.Y.

[22] Filed: Dec. 12, 1974

[21] Appl. No.: 532,092

[52] U.S. Cl. .................. 112/252; 28/1 CS; 30/228; 83/523; 83/909; 139/302; 310/8.2; 310/8.3

[51] Int. Cl.$^2$ .................... D05B 65/00; H01L 41/00

[58] Field of Search ........... 112/252, 122, 129, 130, 112/DIG. 1, DIG. 3; 30/43.92, 45, 228; 83/909, 523, 575, 577, 701; 139/363, 302; 28/1 CS, 72 CS; 66/145 R, 140, 142; 310/8.2, 8.3, 26

[56] References Cited

UNITED STATES PATENTS

| | | | |
|---|---|---|---|
| 2,827,867 | 3/1958 | Happe | 112/122 |
| 3,524,085 | 8/1970 | Shoh | 310/8.2 |
| 3,550,545 | 12/1970 | Cremer | 112/130 |
| 3,666,975 | 5/1972 | Balamuth | 310/8.2 |
| 3,702,948 | 11/1972 | Balamuth | 310/8.2 |
| 3,745,384 | 7/1973 | Blanchard | 310/8.2 |
| 3,778,758 | 12/1973 | Carson | 310/8.2 X |
| 3,815,533 | 6/1974 | Bray | 112/252 |
| 3,824,887 | 7/1974 | Marchard | 83/701 X |

FOREIGN PATENTS OR APPLICATIONS

| | | | |
|---|---|---|---|
| 439,158 | 12/1967 | Switzerland | 139/291 C |

*Primary Examiner*—Werner H. Schroeder
*Assistant Examiner*—Moshe I. Cohen
*Attorney, Agent, or Firm*—Philip H. Pohl; Philip Sperber

[57] ABSTRACT

An ultrasonic cutting apparatus comprising a tuning fork or U-shaped flexural member having legs on which cutting means are mounted, and an ultrasonic drive connected to the flexural member for inducing ultrasonic vibrations in the flexural member. Also disclosed herein is an ultrasonic drive member having a "folded over" resonant holder, and a piezoelectric crystal compressively mounted in the holder by coupling means for transmitting the ultrasonic excitation from the drive to the flexural member.

18 Claims, 11 Drawing Figures

FIG. 2
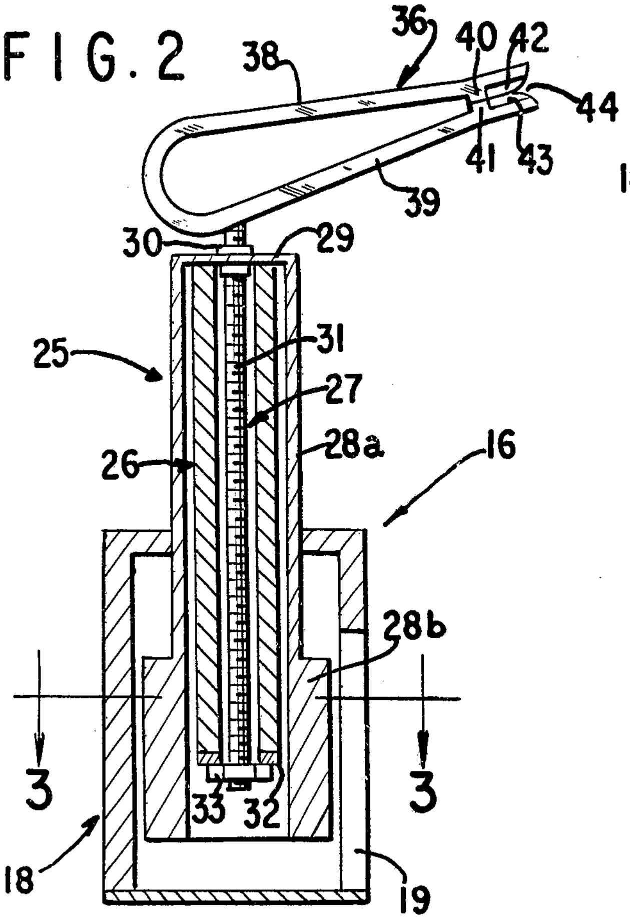
FIG. 3
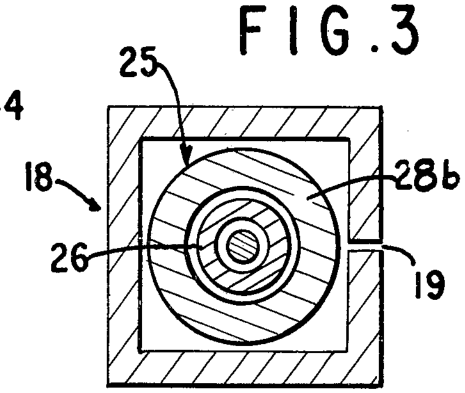
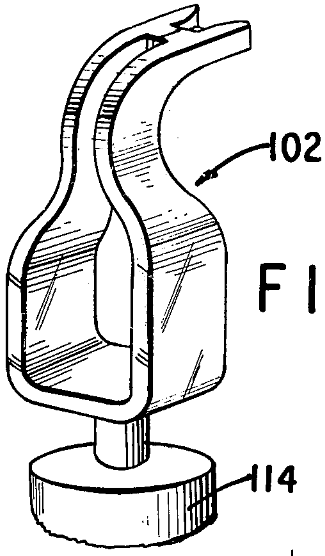
FIG. 6
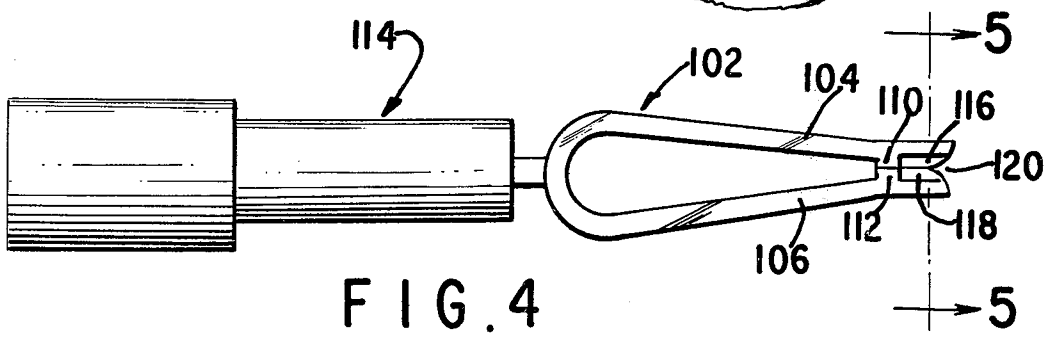
FIG. 4
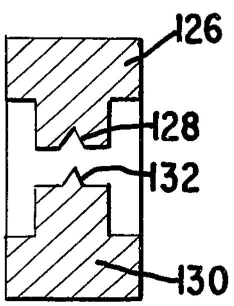
FIG. 5a
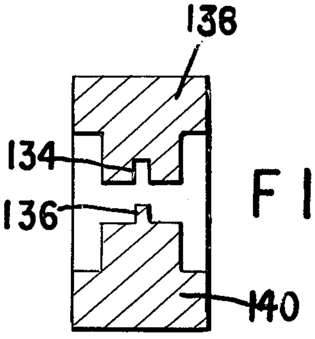
FIG. 5b

ULTRASONIC CUTTING APPARATUS

BACKGROUND OF THE INVENTION

This invention relates to apparatus for use in cutting material. More particularly this invention relates to a ultrasonically vibrated cutting apparatus suitable for cutting fibers or threads. Such apparatus is useful as a thread cutting mechanism in conjunction with industrial sewing machines. During such applications, a thread cutter functions to sever the needle thread and the bobbin thread when stitching in a fabric is completed or to sever the "thread chain" during overstitching. The former application is generally referred to as a thread trimmer, or more appropriately as an under-bed thread trimmer where the mechanism is located below the sewing machine plate supporting the fabric. The latter application is referred to as an overedge chain cutter. At present conventional under-bed thread trimmers are of two types. In one type a high velocity knife edge cuts threads upon contact. A second type operates in a shearing manner similar to scissors. For either type, the needle and bobbin threads are displaced from normal to cutting position by a "picker" so as to insure that sufficient lengths of thread remain at the needle and bobbin. Among the disadvantages of such high-velocity knife thread cutters is their relative mechanical complexity. Such complexities, besides being expensive, lead to maintenance and adjustment problems particularly the latter where the thread characteristics change.

Similarly, a shearing cutter employing either rotary, rectilinear or pivotal motion between two cutting edges is usually a rather complex apparatus (device) and as a result lacks desirable reliability and results in excessive maintenance. For instance, adjustments and maintenance of edge sharpness is critical in such devices.

SUMMARY OF THE INVENTION

We have invented an ultrasonic cutting apparatus for cutting threads and thread chains. The cutting apparatus of this invention comprises a U-shaped flexural member having two opposing legs; cutting means mounted on the aforesaid legs and ultrasonic drive means connected to the flexural section whereby ultrasonic vibrations are induced in the cutting means. Preferably, each of the opposing legs of the flexural member has opposing projections thereon whereby the legs come into impacting contact during vibration thereby inducing the exicitation of vibration modes in addition to the driven mode of vibration. The ultrasonic drive means comprises a resonant holder having a closed end, a tubular ceramic piezo electric crystal mounted within the holder, and compressive coupling means for compressively securing the crystal between one end of the coupling means and the holder's closed end. The coupling means extends through the holder closed end and is fixedly secured to the flexural member.

Accordingly, it is an objective of this invention to provide a device for cutting threads; thread chains; fabrics; and similar materials.

More particularly, it is an objective of this invention to provide a device for cutting moving threads and thread chains in combination with sewing machines.

Another objective of this invention is to provide a novel device in combination with a sewing machine for cutting material which device is simple, effective and reliable in operation.

Still another objective of this invention is to provide an ultrasonic cutting device which does not require an anvil.

Yet another objective of this invention is to provide a device having various modes of vibration induced therein for ultrasonically cutting material.

Another objective of the present invention is to provide a novel ultrasonic drive.

Other objectives and advantages of the device according to the present invention will become apparent from the brief description of the drawings and the preferred embodiments which follow.

BRIEF DESCRIPTION OF THE DRAWINGS

FIG. 2 is a view of cutting apparatus shown in FIG. 1 of the drawing;

FIG. 3 is a cross-sectional view of section 3—3 of FIG. 2;

FIG. 4 is a plan view of the flexural member and drive member of the present invention;

FIGS. 5a and 5b are sectional views along section 5—5 of FIG. 4;

FIG. 6 is a view of a modified version of the flexural member of this invention.

DESCRIPTION OF THE PREFERRED EMBODIMENT

Figures 1, 7, 8, 9, 10:
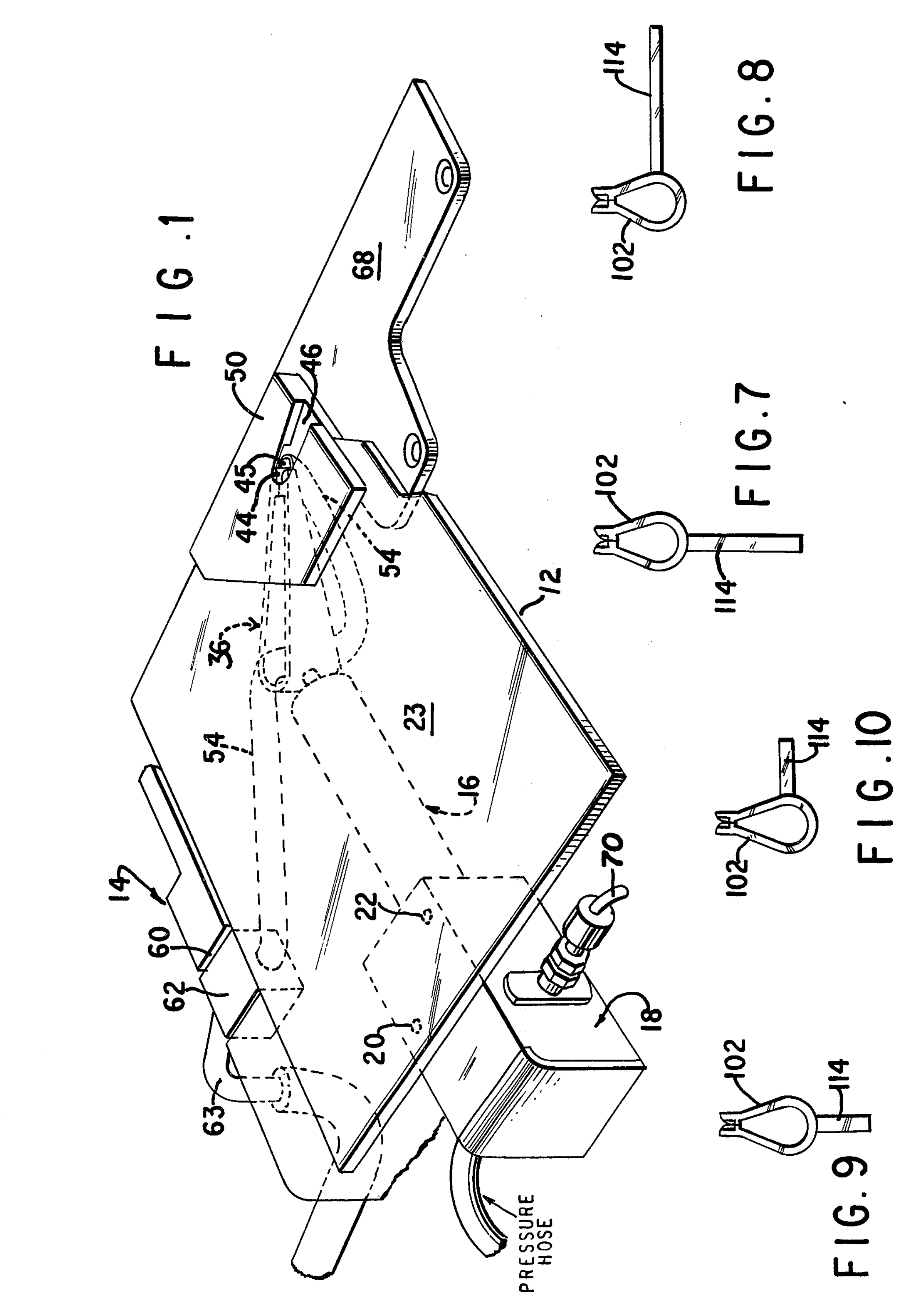
FIG. 1 is a view of the preferred embodiment of the present invention incorporated in a partially shown sewing machine.
FIGS. 7 to 10 are simplified views of various embodiments of the present invention.

The application relates to a novel method and apparatus for cutting threads and more particularly to a novel and advantageous apparatus for use in combination with various types of sewing and stitching machines. The cutting apparatus is preferably an ultrasonically excited U-shaped flexural section having two opposing legs on which are mounted cutting means for severing any suitable material, i.e., threads, which contact same. Basically, the cutting device comprises a mounting block, an ultrasonic driving member attached to the mounting block, a U-shaped flexural member connected to the driving member and excited thereby in the ultrasonic range, and cutting elements mounted on the U-shaped flexural member for contacting and severing material. The ultrasonic cutting device is utilized in combination with means for drawing material into contact with the cutting elements and in conjunction with a sewing or stitching machine wherein the material which is cut ultrasonically is the sewing thread or thread chain.

With reference to FIG. 1 of the drawings, a preferred embodiment of the chain cutter 12 of the present invention is shown as part of the machinery of an over-edge stitcher, not shown. A portion of the cast base 14 of the over-edge stitcher is illustrated on which the various components of the cutter 12 are mounted. Specifically, a drive member 16 is clamped to the case base 14 by a mounting block holding the driving member. The mounting block 18 is securely fixed to the base by screws inserted through a hole 20 and 22 and attached to a plate 23 on the base 14. The drive member is an ultrasonic piezoelectric transducer, more specifically illustrated in FIGS. 2 and 3 of the drawings.

Referring now to FIG. 2 of the drawings, the drive member 16 is shown in a cut-away top view which member appears to be novel by employing a folded-over resonant holder 25 in conjunction with a piezoelectric tublar shaped ceramic crystal 26 and a compressive coupling means 27 dynamically coupling the ceramic crystal 26 and the holder 25 to a flexural member 36. More specifically the resonant holder 25 is a hollow tubular shaped metal structure having a specific length and inertia with a thin walled section 28a and a somewhat shorter thick walled section 28b. The resonant holder is secured within the mounting block 18 at its nodal point (i.e. point of least amplitude) by the clamping action of the mounting blocks 18, as illustrated in FIG. 3 showing a slot 19 in the block securing the clamping force. The end of the holder outside the mounting block is closed by end wall 29 having an internally threaded collar 30 through which a long coupling screw 31 extends. The ceramic crystal 26 is held at one end against the end wall 29 by the compressive force of a washer 32 at the other end of the crystal and a nut 33 threadedly fastened to the coupling screw and compressively holding the washer 32. Structurally the crystal 26, the resonant holder and the coupling screw and attendant washer and nut form a unitary vibratory system when dynamically energized by the piezoelectric response of the crystal to a suitable electronic current. The ceramic crystal which may be made of lead zirconate titanate is internally and externally silvered, not shown, to provide electrical contact surfaces for the electrical conductor 70.

The coupling screw extending beyond the end wall 29 is threadedly attached to the flexural member 36 on one side thereof.

The flexural member as previously discussed is a tuning fork U-shaped member having two legs 38 and 39, each leg having opposing raised surfaces 40 and 41 each respectively adjacent a pair of cutting tips 42 and 43.

The cutting tips 42 and 43 are fixedly mounted respectively on the end of each leg of the flexural member thereby forming a cutting throat 44 in the space between them.

The opposing raised surfaces 40 and 41 on each of the legs which cause the legs to impact on each other when the flexural member is vibrated serve to induce secondary modes of vibration in addition to the driving mode. The secondary modes of vibration exhibit larger amplitudes than the driving mode and this is believed to aid in drawing the thread between the cutting tips 42 and 43 thereby effectively improving the operation thereof. Additionally, the life of the cutting tips is also increased since the raised surfaces act to prevent undue wear to the cutting tips.

Also mounted on the stitcher frame 14 are means for drawing the thread chain into the cutting throat 44. Briefly the means for drawing the thread chain in the cutting throat comprises a suction means having a suction port 45 which is adjacent a thread guide opening 46 located in plate 50 of the sewing machine. The thread guide opening narrows toward the area which is positioned over the suction port 45 and to cutting throat 44. This allows the thread chain, which is either trailing or leading the stitched fabric, to be drawn automatically into the cutting throat by the suction applied through the openings as the edge of the stitched fabric passes over the cutting throat.

The suction means is additionally formed of suction tube 54 one end of which is the port 45 inclined downwardly from the thread guide opening below the flexural member and curving around the drive member in a multiple bend, then upwardly to a cutout 60 in the frame. The tube 54 is there attached to a suction fitting interface 62. The interface 62 is connected to another tube 63 and from there to a source not shown capable of producing sufficient vacuum pressure to maintain sufficient suction.

Not shown in the drawings is an enclosure in the form of a multi-walled enclosure which may enclose the flexural member and which effectively protects and shields the flexural member from inadvertent damage. Various plates are mounted on the stitcher frame 14, the stitcher table plate 23 being generally located over the ultrasonic cutting apparatus and having the thread guide opening plate 50 thereon. Also shown but not comprising a part of the invention is a movable feed dog plate 68. A number of saw toothed-feed dogs, not shown, are located on the top surface of the feed dog plate as are several slotted openings through which needles may reciprocally move, as for instance an overedge needle and a safety sewing needle.

While the preferred embodiment according to this invention has been described above, various embodiments, variations, modifications and modes of operation are regarded as part of this invention, and are described hereinafter.

A major part of this invention is the U-shaped flexural member and its various modes of operation. Basically the cutting device of this invention as shown in FIGS. 4–10 of the drawings is a U-shaped or tuning fork shaped flexural member (comprising two opposingly located legs on the open end thereof, and a drive member for providing ultrasonic vibrations in the range of from about 15,000 Hertz to 100,000 Hertz, though 20,000 to 40,000 Hertz is preferred. Preferably the opposing legs of the flexural member are at a spaced distance from each other whereby projecting opposing surfaces thereof impact on each other during energization of the flexural member. Additionally a cutting tip is fixedly mounted adjacent each projection on the end of each leg of the flexural member.

Such projections on the opposing surfaces of each leg serve two extremely important functions. The first is that the impacting of the legs induces additional modes of vibration which aids in cutting and in drawing the thread into the cutting throat. It is believed that as some of the additional modes of vibration have larger amplitudes than the primary mode, this allows the thread to more easily enter between the cutting tips. The second function is that the two projections prevent undue wear of the cutting tips. Without the presence of such projections, the cutting tips would continue to wear rapidly.

Such cutting device according to the present invention is illustrated in FIG. 4 of the drawing having a U-shaped flexural member 102 with two legs 104 and 106 and impacting projection surfaces 110 and 112 on the inside of each respective leg 104 and 106. A rod shaped extension is used to illustrate the drive member 114 described hereinabove and is fixedly connected to the flexural member at the hereinafter described drive points.

A pair of cutting tips 116 and 118 are mounted on the end of each of the respective legs 104 and 106. The cutting tips each have inwardly directed semi-circular forward edges functioning in guiding materials into the space between the two tips. The area defined by the two semi-circular edges is designated herein as the cutting throat 120. While two different versions of cutting tips are preferred, the two tips may be opposingly symmetrical.

Specifically shown in FIG. 5a of the drawings is a cross sectional view of a pair of tips designated herein as pounding tips. Basically the pounding tips type of cutting structure comprises an anvil tip 126 having a groove 128 therein in the cutting face parallel to the axis of the legs and a hammer tip 130 having an upstanding ridge 132 facing the groove 128 and adapted to fit in the groove as the tips contact each other.

A second version of a pair of cutting tips is shown in cross-sectional view in FIG. 5b and is called shearing tips. One tip has a rectangular channel 134 and the opposing tip has an upstanding bar 136 fitting into the channel as the tips contact each other and functions in a manner akin to scissors. Each of the aforesaid tips may be preferable in different modes of operation and with various different materials.

While the preferred embodiment of the cutting apparatus as illustrated in FIGS. 1 and 2 of the drawings show a driving member in an off center position relative to the symmetrical axis of the flexural member, such driving member may be located in any desired position in reference to the flexural member. The modes and amplitude of vibration and excitation of the flexural member will be different depending on location, size of the structure as well as shape and taper of such structure.

In addition it is possible to bend the legs of the flexural member in another plane at a desired angle as illustrated in FIG. 6 of the drawings where the legs, while still parallel as before are bent along their long axis. Such a structure does not change the functional mode of operation of the flexural member yet allows the flexural member to be bent to accommodate the spatial requirements of apparatus in which the cutting device is incorporated.

It is well known in the art of ultrasonically vibrated solid systems that length, shape, material and frequency are interrelated and that various design factors are considered in obtaining the desired vibratory and amplitude factors. Thus FIGS. 7 through 10 illustrate various different arrangements of flexural member 102 and driving member 114. FIG. 9 of the drawings is illustrative of the device also illustrated in FIG. 4 and illustrates a flexural member and drive having composite resonance and a symetrical vibratory excitation or drive. FIG. 7 illustrates a similar configuration but with a drive member having a length which is equivalent to one half the resonant symmetrical vibrational drive. FIG. 8 illustrates a version of the cutting device having the extension connected to the flexural member at an angle perpendicular to the axis of symmetry of the flexural member. As such, the system or device illustrated functions as a self-resonant flexural and extensional section with a symmetrical drive. Similarly, the system illustrated in FIG. 10 of the drawings differs from that shown in FIG. 8 in that the length of the extensional section does not induce self resonance in the flexural and extensional sections but rather induces a composite resonance. By composite resonance applicants mean the resonance exhibited by the flexural and driving member assembly as a unit.

The invention described herein appears to possess unique qualities in terms of function and has demonstrated effective application in the cutting of threads, thread chains, fabrics, paper and several other materials. Therefore with the flexural member and cutting throat, the long axis of the transducer drive may be at any of the various desired angles to the direction of movement of the material being cut. In the preferred application, such as in combination with certain conventional sewing and stitching machines, such ability to orient the long axis of the transducer parallel to the direction the movement of material being worked on allows simpler and more practical installation of the cutting device in a sewing machine. Secondly, a rigidly mounted anvil is dispensed with and cutting is achieved at the cutting throat between the tips mounted on the legs of the flexural member. The two legs are preferably vibrating 180 degrees out of phase with each other, that is the two legs are vibrating towards one another at the same moment and away from each other in point of time. The arrangement and proximity of the vibrating legs affects an impacting action between their opposing surfaces thereby inducing vibrational modes in addition to the driven mode.

Further, for purposes of explanation, the flexural member as previously described resembles a tuning fork with the two legs forming the open end. The flexural member can preferably be manufactured to a length in excess of two flexural wavelengths, and to exhibit either self-resonance or composite resonance together with the driving section. The flexural member wavelength for a member having a cross-section with a small actual size compared to the wavelength (thus allowing one to disregard rotary initial effects) is approximately computed by the equation: Wavelength = constant $C_L t/f$ where $C_L$ is the velocity of a longitudinal wave; t is the thickness of the section in the direction of flexural displacements; and f is the frequency of vibration.

Typically with metal members and sections having a 0.1 inch thickness and at a frequency of 25 Kilohertz (KHz) the flexural wavelength is in the range of from 1 to about 1¼ inches. Further the ratio of the amplitude of vibration at the ends of the legs of the flexural member to that at the driving point, i.e., the point of connection of the flexural member and the extension is dependent upon the driving point location. With no loading at the vibrating legs, the amplitude ratio is about 1.4 with the driving point at an antinodal point of flexural member vibration. The ratio is larger when the driving point is not at such anti-nodal point. Secondly the amplitude ratio may be further influenced by tapering the legs of the flexural member along their axis. An understanding of the various theoretical basis for the above description discussion can be had in *VIBRATION ANALYSIS TABLES* by R. E. Bishop and D. C. Johnson (Cambridge Univ. Press. 1956).

An important factor of the present invention appears to result from the impacting of the vibrating legs upon each other. When such impacting occurs, lower-frequency flexural vibrations are also induced, some of which exhibit higher amplitudes than the driven mode. When such impacting occurs the cutting efficacy of the device is significantly increased.

Having thus fully disclosed our invention and wishing to cover those variations and modifications which would be apparent to those skilled in the art, but without departing from either the scope or spirit of the invention,

We claim:

1. An ultrasonic cutting apparatus comprising a U-shaped flexural member having two legs in opposing relationship;

ultrasonic drive means connected to said flexural member for communicatingly exciting said flexural member; and cutting means mounted on each of said legs in an opposing relationship to each other for cutting material placed therebetween.

2. The apparatus according to claim 1 wherein said legs have projecting surfaces in opposing and spaced relationship to each other, said surfaces contacting and impacting upon each other when ultrasonic vibrations are induced in said flexural member whereby the impacting action induces secondary modes of vibration to said flexural member.

3. The apparatus according to claim 1 wherein said ultrasonic drive means comprises a resonant holder connected to said flexural member a piezoelectric crystal mounted in said holder, and responsively excited in the ultrasonic range by electrical excitation means, a coupling means compressively coupling said crystal to said holder.

4. The apparatus according to claim 3 wherein said piezoelectric crystal is a hollow tube, said holder has a closed end abutting one end of said crystal, said holder being folded over said crystal, and said coupling means compressively holding the other end of said crystal against said abutting closed end whereby the vibrations of said crystal are transmitted to the holder.

5. The apparatus of claim 4 which additionally comprises, a frame, a mounting block, fixedly mounted on said frame, said block securely clamping said holder at a nodal point thereof;

a plate mounted on said frame above said frame, said plate having an opening adjacent said cutting means; and suction means mounted on said frame below said plate and communicating with said plate opening for applying a suction force to material placed over said opening whereby the material is drawn into contact with said cutting means.

6. The apparatus according to claim 1 wherein said cutting means comprises a first cutting tip mounted on a first of said two legs of said flexural member, and a second cutting tip mounted on the second of said two legs in opposing relationship to said first cutting tip.

7. The apparatus according to claim 1 wherein said ultrasonic drive means induces said two legs to vibrate 180° out of phase.

8. The apparatus of claim 2 wherein said ultrasonic drive means induces said two legs to vibrate 180° apart.

9. The apparatus according to claim 1 wherein said ultrasonic drive means is connected to said flexural member parallel to the axis of symmetry thereof.

10. The apparatus according to claim 5 wherein said plate and said frame are incorporated in a sewing machine.

11. The apparatus according to claim 6 wherein said first cutting tip comprises an anvil tip having a rectangular slot and said second cutting tip comprises a base and a rectangular bar mounted on said base in opposing relationship to said slot.

12. The apparatus according to claim 6 wherein said first cutting tip comprises an anvil having a groove and said second cutting tip comprises a base and a ridge shaped projection on said base in opposing relationship to said groove.

13. The apparatus according to claim 1 wherein said ultrasonic driving means is connected to said flexural member at about an anti-nodal point thereof.

14. The apparatus according to claim 1 wherein said ultrasonic drive means is connected to said flexural member at about a nodal point thereof.

15. The apparatus according to claim 5 wherein said connecting means is connected to said flexural member at an oblique angle to the axis of symmetry of said flexural member.

16. The apparatus according to claim 6 wherein each of said cutting tips has a semi-circular forward edge, the circular edges inclining inwardly toward each other and forming a cutting throat therebetween.

17. The apparatus according to claim 1 comprising impact means intermittently contacting at least one of said legs for inducing secondary modes of vibration to said flexural member when ultrasonic vibrations are induced in said flexural member.

18. The apparatus of claim 1 comprising impact means mounted on at least one of said legs, and fixed means mounted adjacent said impact means inducing secondary modes of vibration to said flexural member when ultrasonic vibrations are induced in said flexural member.

* * * * *